(12) United States Patent
Hirao

(10) Patent No.: US 11,651,894 B2
(45) Date of Patent: May 16, 2023

(54) MULTILAYER CERAMIC CAPACITOR AND SEMICONDUCTOR DEVICE

(71) Applicant: Murata Manufacturing Co., Ltd., Nagaokakyo (JP)

(72) Inventor: Takahiro Hirao, Nagaokakyo (JP)

(73) Assignee: MURATA MANUFACTURING CO., LTD. MURATA MANUFACTURING, Kyoto (JP)

( * ) Notice: Subject to any disclaimer, the term of this patent is extended or adjusted under 35 U.S.C. 154(b) by 0 days.

(21) Appl. No.: 17/210,602

(22) Filed: Mar. 24, 2021

(65) Prior Publication Data

US 2021/0313113 A1 Oct. 7, 2021

(30) Foreign Application Priority Data

Apr. 6, 2020 (JP) .............................. JP2020-068180

(51) Int. Cl.
| | |
|---|---|
| *H01G 4/005* | (2006.01) |
| *H01G 4/30* | (2006.01) |
| *H01G 4/12* | (2006.01) |
| *H01G 4/248* | (2006.01) |
| *H01G 2/06* | (2006.01) |
| *H01G 4/232* | (2006.01) |

(52) U.S. Cl.
CPC .............. *H01G 4/005* (2013.01); *H01G 2/065* (2013.01); *H01G 4/1209* (2013.01); *H01G 4/232* (2013.01); *H01G 4/248* (2013.01); *H01G 4/30* (2013.01)

(58) Field of Classification Search
CPC ........ H01G 4/1208; H01G 4/30; H01G 4/248; H01G 4/232; H01G 4/005; H01G 2/065; H01G 4/12; H01G 4/224; H01G 4/1209

USPC ......................... 361/301.4, 303, 321.2, 321.1
See application file for complete search history.

(56) References Cited

U.S. PATENT DOCUMENTS

| | | | |
|---|---|---|---|
| 9,263,186 | B2 | 2/2016 | Li et al. |
| 2014/0311789 | A1* | 10/2014 | Han .................. H01G 4/12 361/301.4 |
| 2017/0162327 | A1* | 6/2017 | Mizuno ............. H01G 4/232 |

(Continued)

FOREIGN PATENT DOCUMENTS

| | | |
|---|---|---|
| JP | H01187901 A | 7/1989 |
| JP | 2000-195741 A | 7/2000 |

(Continued)

OTHER PUBLICATIONS

Office Action in JP2020-068180, dated Sep. 27, 2022, 4 pages.

*Primary Examiner* — Arun Ramaswamy
(74) *Attorney, Agent, or Firm* — Keating & Bennett, LLP

(57) ABSTRACT

A multilayer ceramic capacitor includes a multilayer body including dielectric layers, first inner electrodes, and second inner electrodes stacked on one another, a first outer electrode electrically connected to the first inner electrodes, and a second outer electrode electrically connected to the second inner electrodes. The multilayer body includes first and second side surfaces respectively including first and second recesses where a midsection of each of the first and second side surfaces in a length direction is recessed inward in a width direction. When the multilayer ceramic capacitor is viewed in a stacking direction, a dimension of each of the first and second recesses in the length direction is smaller on an inner side than on an outer side in the width direction.

13 Claims, 13 Drawing Sheets

(56) References Cited

U.S. PATENT DOCUMENTS

2017/0301471 A1* 10/2017 Ono ................... H01G 4/224
2017/0345567 A1* 11/2017 Sakate .................. H01G 4/30

FOREIGN PATENT DOCUMENTS

| JP | 3427680 B2 * | 7/2003 | ............... H01G 4/12 |
| JP | 2008166408 A | 7/2008 | |
| JP | 2016-012640 A | 1/2016 | |
| JP | 2017-059820 A | 3/2017 | |

* cited by examiner

MULTILAYER CERAMIC CAPACITOR AND SEMICONDUCTOR DEVICE

CROSS REFERENCE TO RELATED APPLICATIONS

This application claims the benefit of priority to Japanese Patent Application No. 2020-068180 filed on Apr. 6, 2020. The entire contents of this application are hereby incorporated herein by reference.

BACKGROUND OF THE INVENTION

1. Field of the Invention

The present invention relates to a multilayer ceramic capacitor and a semiconductor device.

2. Description of the Related Art

A multilayer ceramic capacitor known in the art includes a multilayer body and a pair of outer electrodes. The multilayer body has a layered structure in which dielectric layers and inner electrodes are alternately stacked on one another. Each outer electrode of the pair of outer electrodes is disposed on a corresponding end surface of the multilayer body.

Such a multilayer ceramic capacitor is disclosed in U.S. Pat. No. 9,263,186. Referring to FIG. 12, multilayer ceramic capacitors 410 and solder balls 420 are disposed on a substrate 400. The solder balls 420 in FIG. 12 are arranged in a grid array on the substrate 400, which has a rectangular shape. The multilayer ceramic capacitors 410 are disposed on the substrate 400 so as not to overlap the solder balls 420. The solder balls 420 may, for example, be needed to dissipate heat from the substrate 400 and to provide signal paths. For this reason, it is not preferable to reduce the number of solder balls.

One of the multilayer ceramic capacitors 410 illustrated in FIG. 12, or more specifically, the multilayer ceramic capacitor 410 in the midsection is arranged obliquely to the edges of the substrate 400. Some of the solder balls 420 may not be optimally positioned in relation to the multilayer ceramic capacitor 410 arranged obliquely to the edges of the substrate 400 and thus can come into contact with side surfaces of the multilayer ceramic capacitor 410.

Referring to FIG. 13, a solder ball 420A is in contact with a side surface of a multilayer ceramic capacitor 410A, which is at the lower right of the substrate 400. When the solder ball 420A in the molten state flows along a side surface of the multilayer ceramic capacitor 410A including a pair of outer electrodes 411A, electrical continuity will be established between the outer electrodes 411A, and consequently, a short circuit can occur.

As a workaround, the side surfaces of the multilayer ceramic capacitor 410 may be recessed inward, which may be a practical approach to eliminate or reduce the possibility that some of the solder balls 420 will come into contact with the side surfaces of the multilayer ceramic capacitor 410.

Such a multilayer ceramic capacitor is disclosed in Japanese Unexamined Patent Application Publication No. 2000-195741. Referring to FIG. 14, a multilayer ceramic capacitor 140 has a pair of side surfaces 140a, which each have a recess 150. The dielectric layers and the inner electrodes are stacked on one another in a stacking direction T. When the multilayer ceramic capacitor 140 in FIG. 14 is viewed in the stacking direction T, each recess 150 has a rectangular shape. The multilayer ceramic capacitor 140 includes a pair of outer electrodes 141, which face each other in a length direction L. The side surfaces 140a face each other in a width direction W. The stacking direction T is orthogonal to the length direction L and the width direction W.

In the case that the multilayer ceramic capacitor 140 illustrated in FIG. 14 is disposed so as to be arranged obliquely to the edges of the substrate 400 illustrated in FIG. 12, the recesses 150 in the side surfaces 140a eliminate or reduce the possibility that some of the solder balls 420 will come into contact with the side surfaces 140a of the multilayer ceramic capacitor 140.

However, there is a downside to this. Forming the rectangular recesses 150 in the respective side surfaces 140a results in a reduction in the area of overlaps between the inner electrodes separated by the dielectric layers, and the capacitance of the multilayer ceramic capacitor 140 illustrated in FIG. 14 is reduced correspondingly.

SUMMARY OF THE INVENTION

In order to reduce or prevent a reduction in capacitance, preferred embodiments of the present invention provide multilayer ceramic capacitors that each include side surfaces that are prevented from contacting solder balls on a substrate onto which the multilayer ceramic capacitor is mounted, and semiconductor devices each including such multilayer ceramic capacitors.

A multilayer ceramic capacitor according to a preferred embodiment of the present invention includes a multilayer body, a first outer electrode, and a second outer electrode. The multilayer body includes dielectric layers, first inner electrodes, and second inner electrodes. The dielectric layers and the first and second inner electrodes are stacked on one another. The multilayer body includes a first principal surface, a second principal surface, a first side surface, a second side surface, a first end surface, and a second end surface. The first principal surface is opposite the second principal surface in a stacking direction in which the dielectric layers, the first inner electrodes, the second inner electrodes are stacked on one another. The first side surface is opposite the second side surface in a width direction orthogonal or substantially orthogonal to the stacking direction. The first end surface is opposite the second end surface in a length direction orthogonal or substantially orthogonal to both the stacking direction and the width direction. The first outer electrode is electrically connected to the first inner electrodes and located on the first end surface of the multilayer body. The second outer electrode is electrically connected to the second inner electrodes and located on the second end surface of the multilayer body. The first side surface includes a first recess where a midsection of the first side surface in the length direction is recessed inward in the width direction. The second side surface includes a second recess where a midsection of the second side surface in the length direction is recessed inward in the width direction. When the multilayer ceramic capacitor is viewed in the stacking direction, a dimension of each of the first recess and the second recess in the length direction is smaller on an inner side than on an outer side in the width direction.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, features of the present invention will be described with reference to preferred embodiments of the present invention and the drawings.

First Preferred Embodiment

Figure 1:
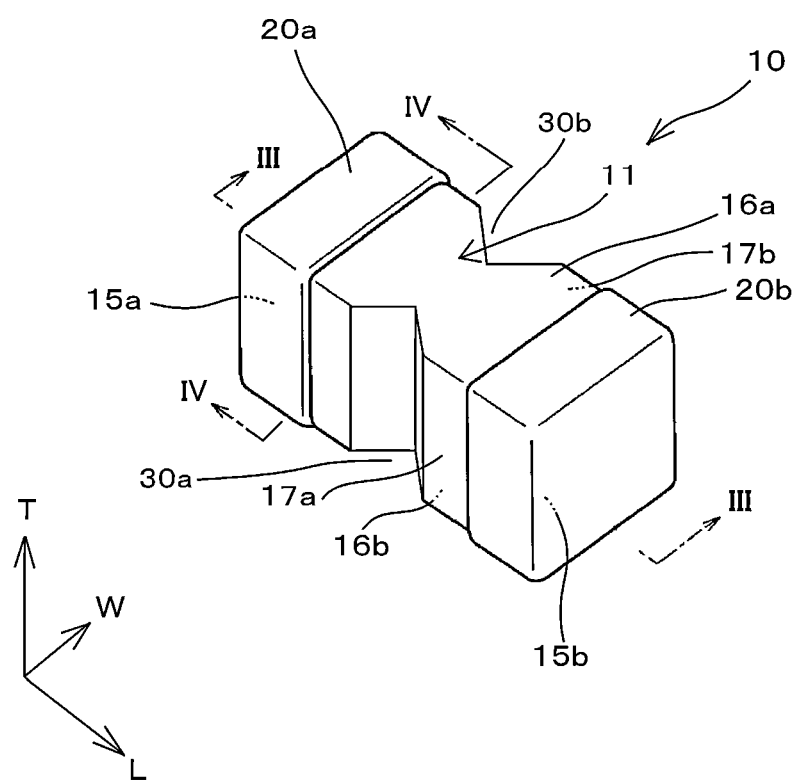
FIG. 1 is a perspective view of a multilayer ceramic capacitor according to a first preferred embodiment of the present invention.
Figure 2:
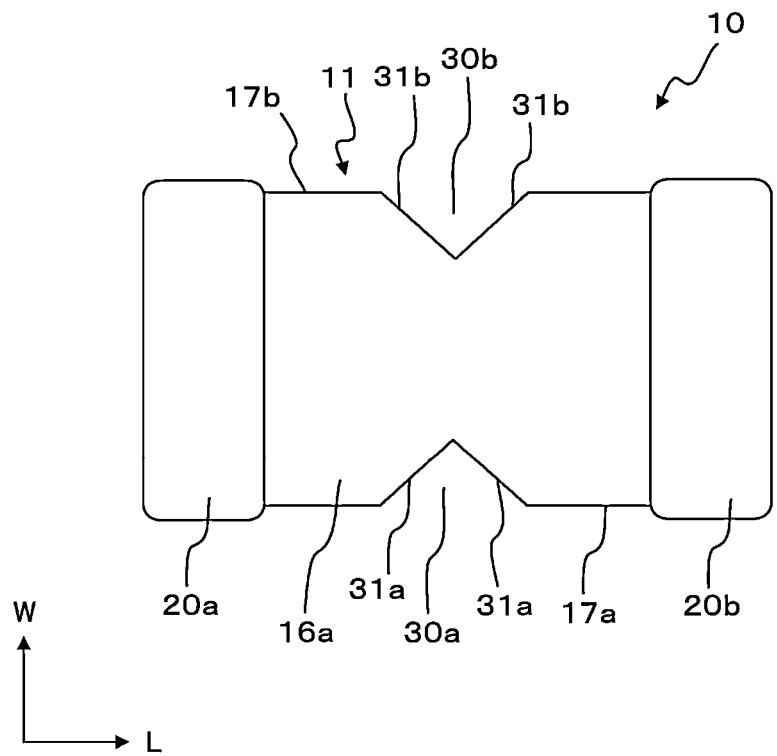
FIG. 2 is a plan view of the multilayer ceramic capacitor in FIG. 1, illustrating the multilayer ceramic capacitor as seen in a stacking direction.
Figure 3:
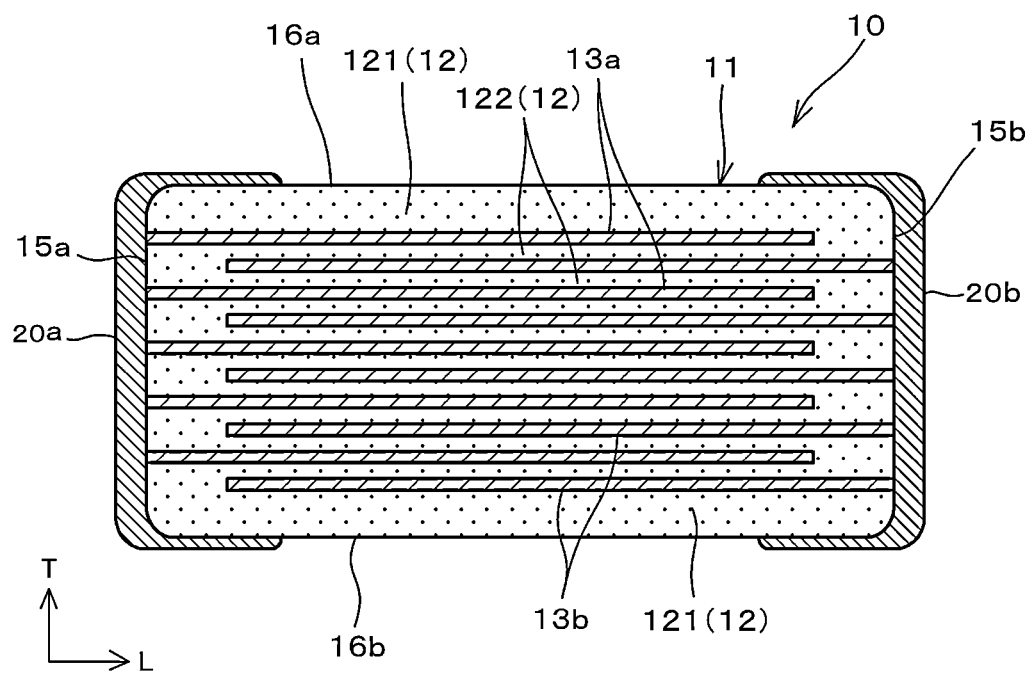
FIG. 3 is a sectional view of the multilayer ceramic capacitor taken along line in FIG. 1.
Figure 4:
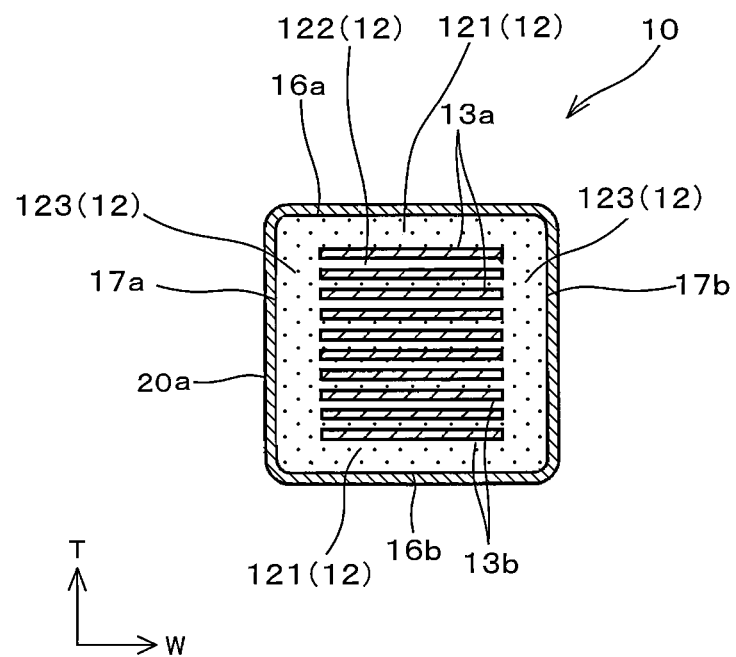
FIG. 4 is a sectional view of the multilayer ceramic capacitor taken along line IV-IV in FIG. 1.

FIG. 1 is a perspective view of a multilayer ceramic capacitor 10 according to a first preferred embodiment of the present invention. FIG. 2 is a plan view of the multilayer ceramic capacitor 10 in FIG. 1, illustrating the multilayer ceramic capacitor 10 as seen in a stacking direction T. FIG. 3 is a sectional view of the multilayer ceramic capacitor 10 taken along line III-III in FIG. 1. FIG. 4 is a sectional view of the multilayer ceramic capacitor 10 taken along line IV-IV in FIG. 1.

The multilayer ceramic capacitor 10 includes a multilayer body 11, a first outer electrode 20a, and a second outer electrode 20b. The first outer electrode 20a and the second outer electrode 20b face each other as illustrated in FIG. 1.

A direction in which the first outer electrode 20a and the second outer electrode 20b face each other is a length direction of the multilayer ceramic capacitor 10 and is herein denoted by L. A direction in which dielectric layers 12, inner electrodes 13a, and inner electrodes 13b are stacked on one another is herein referred to as a stacking direction and denoted by T. These layers and electrodes will be described later. A direction orthogonal or substantially orthogonal to both the length direction L and the stacking direction T is herein referred to as a width direction and denoted by W. Any two of these directions (i.e., the length direction L, the stacking direction T, and the width direction W) are orthogonal or substantially orthogonal to each other.

The multilayer body 11 includes a first end surface 15a, a second end surface 15b, a first principal surface 16a, a second principal surface 16b, a first side surface 17a, and a second side surface 17b. The first end surface 15a is opposite the second end surface 15b in the length direction L. The first principal surface 16a is opposite the second principal surface 16b in the stacking direction T. The first side surface 17a is opposite the second side surface 17b in the width direction W.

Corners and ridges of the multilayer body 11 are preferably rounded. Each corner is where three surfaces of the multilayer body 11 meet. Each ridge is where two surfaces of the multilayer body 11 meet.

Referring to FIGS. 3 and 4, the multilayer body 11 includes the dielectric layers 12, first inner electrodes 13a, and second inner electrodes 13b, which are stacked on one another. More specifically, the multilayer body 11 has a layered structure in which the first inner electrodes 13a and the second inner electrodes 13b are alternately stacked and separated by the dielectric layers 12 in the stacking direction T.

As illustrated in FIG. 4, the dielectric layers 12 include outer dielectric layers 121, inner dielectric layers 122, and a margin 123. In the stacking direction T, the outer dielectric layers 121 are each closer to outer surfaces of the multilayer body 11 than the outermost inner electrode (the inner electrode 13a or 13b closer than the other inner electrodes 13a and 13b to the outer surface in the stacking direction T). The inner dielectric layers 122 are each disposed between two inner electrodes (i.e., the inner electrodes 13a and 13b) adjacent to each other in the stacking direction T. When the multilayer body is viewed in the stacking direction T, none of the inner electrodes 13a and 13b is disposed in the margin 123.

More specifically, one of the outer dielectric layers 121 is disposed between the outermost inner electrode 13a in the stacking direction T and the first principal surface 16a of the multilayer body 11, and the other outer dielectric layer 121 is disposed between the outermost inner electrode 13b and the second principal surface 16b of the multilayer body 11. Each of the inner dielectric layers 122 is disposed between the corresponding first inner electrode 13a and the corresponding second inner electrode 13b that are adjacent to each other in the stacking direction T. The margin 123 is closer than the outer dielectric layers 121 and the inner dielectric layers 122 to the outer surface in the width direction W.

The dielectric layers 12 are preferably made of a ceramic material including, for example, $BaTiO_3$, $CaTiO_3$, $SrTiO_3$, $SrZrO_3$, or $CaZrO_3$ as a principal component. The ceramic material may include, in addition to the principal component, minor amounts of an accessory component such as Mn compounds, Fe compounds, Cr compounds, Co compounds, or Ni compounds, for example.

The first inner electrodes 13a extend to the first end surface 15a of the multilayer body 11. The second inner electrodes 13b extend to the second end surface 15b of the multilayer body 11.

The multilayer body 11 may include, in addition to the first inner electrodes 13a and the second inner electrodes 13b, inner electrodes that are not exposed at a surface of the multilayer body 11.

The first side surface 17a of the multilayer body 11 includes a first recess 30a, where the midsection of the first side surface 17a in the length direction L is recessed inward in the width direction W. The second side surface 17b of the multilayer body 11 includes a second recess 30b, where the midsection of the second side surface 17b in the length direction L is recessed inward in the width direction W. These recesses will be described later. The first inner electrodes 13a and the second inner electrodes 13b are recessed inward in the width direction W and have a shape corresponding to the first recess 30a and the second recess 30b.

The first inner electrodes 13a each include a facing electrode portion and an extended electrode portion. The facing electrode portion of each first inner electrode 13a faces the corresponding second inner electrode 13b. The extended electrode portion extends between the facing electrode portion and the first end surface 15a of the multilayer body 11. The second inner electrodes 13b each include a facing electrode portion and an extended electrode portion. The facing electrode portion of each second inner electrode 13b faces the corresponding first inner electrode 13a. The extended electrode portion extends between the facing electrode portion and the second end surface 15b of the multilayer body 11.

The facing electrode portion of the first inner electrode 13a and the facing electrode portion of the second inner electrode 13b face each other with the dielectric layer 12 therebetween such that a capacitance is generated, thus enabling the multilayer body to define and function as a capacitor.

The first inner electrodes 13a and the second inner electrodes 13b may preferably include a metal such as, for example, Ni, Cu, Ag, Pd, Pt, Fe, Ti, Cr, Sn, or Au or may include an alloy of these metals. The first inner electrodes 13a and the second inner electrodes 13b may include the same dielectric ceramic material as a dielectric ceramic material included in the dielectric layers 12. In this case, the dielectric ceramic content in the first inner electrodes 13a and the second inner electrodes 13b may preferably be, for example, equal to or less than about 20 vol %.

It is not required that the inner electrodes 13a and 13b are made of the same material. Also, it is not required that each of the inner electrodes 13a and 13b is made of the same material. Different materials may be used for different portions of each inner electrode.

The first outer electrode 20a is disposed on the first end surface 15a of the multilayer body 11. The first outer electrode 20a in the present preferred embodiment covers the entirety or substantially the entirety of the first end surface 15a of the multilayer body 11 and extends from the first end surface 15a onto the first principal surface 16a, the second principal surface 16b, the first side surface 17a, and the second side surface 17b.

The second outer electrode 20b is disposed on the second end surface 15b of the multilayer body 11. The second outer electrode 20b in the present preferred embodiment covers the entirety or substantially the entirety of the second end surface 15b of the multilayer body 11 and extends from the second end surface 15b onto the first principal surface 16a, the second principal surface 16b, the first side surface 17a, and the second side surface 17b.

The first outer electrode 20a and the second outer electrode 20b may each include, for example, a base electrode layer and a plating layer on the base electrode layer.

The base electrode layer may include, for example, a baked electrode layer, a resin electrode layer, or a thin-film electrode layer, or varying combinations of these layers, each of which will be described later. The base electrode layer may be made of the same ceramic material as that of the dielectric layers 12 or a material similar to that of the dielectric layers 12 or may include glass, in which case the coefficient of linear expansion of the first outer electrode 20a and the second outer electrode 20b may be close to the coefficient of linear expansion of the dielectric layers 12. In the case that the base electrode layer includes the ceramic material described above or glass, the ceramic material content or the glass content in the outer electrode is preferably, for example, equal to or more than about 30 vol % and equal to or less than about 70 vol %.

The base electrode layer may include one or more baked electrode layers, each of which includes glass and metal, for example. The baked electrode layer may include a metal such as, for example, Cu, Ni, Ag, Pd, Ti, Cr, or Au or may contain an alloy of these metals.

The baked electrode layer is obtained by baking a multilayer body coated with a conductive paste containing glass and metal.

The resin electrode layer may include conductive particles and a thermosetting resin, for example. The resin electrode layer may be provided directly on a ceramic raw material, in which case the baked electrode layer may be omitted. The base electrode layer may include one or more resin electrode layers, for example.

The thin-film electrode layer is a deposit of metallic particles and preferably has a thickness of, for example, not more than about 1 μm. The thin-film electrode layer may be formed by sputtering, vapor deposition, or any other known method for forming thin films.

The plating layer on the base electrode layer may include, for example, a metal such as Cu, Ni, Ag, Pd, Ti, Cr, or Au or may include an alloy made mainly of these metals. The base electrode layer may be overlaid with one or more plating layers. The plating layer preferably has a double-layer structure including a Ni plating layer and a Sn plating layer, for example. The Ni plating layer protects the base electrode layer from erosion by solder when the multilayer ceramic capacitor 10 is mounted. The Sn plating layer improves solder wettability needed for mounting of the multilayer ceramic capacitor 10.

The first outer electrode 20a and the second outer electrode 20b may each be a plating layer disposed directly on the multilayer body 11, in which case the base electrode layer may be omitted.

The first side surface 17a of the multilayer ceramic capacitor 10 according to the first preferred embodiment includes the first recess 30a, where the midsection of the first side surface 17a in the length direction L is recessed inward in the width direction W. The second side surface 17b of the multilayer ceramic capacitor 10 includes the second recess 30b, where the midsection of the second side surface 17b in the length direction L is recessed inward in the width direction W.

When the multilayer ceramic capacitor 10 is viewed in the stacking direction T, the dimension of each of the first recess 30a and the second recess 30b in the length direction L is smaller on an inner side than on an outer side in the width direction W. The first recess 30a is defined by surfaces 31a, and the second recess 30b is defined by surfaces 31b. In the present preferred embodiment, the surfaces 31a and the surfaces 31b are flat. When the multilayer ceramic capacitor 10 is viewed in the stacking direction T, the surfaces 31a extend obliquely from the first side surface 17a toward the center of the multilayer body in the width direction W, and the surfaces 31b extend obliquely and from the second side surface 17b toward the center of the multilayer body in the width direction W. The dimension of each of the first recess 30a and the second recess 30b in the length direction L is smaller on the inner side in the width direction W accordingly. With this structure, the first recess 30a and the second recess 30b as seen in the stacking direction T have a triangular or substantially triangular shape as illustrated in FIG. 2.

The multilayer ceramic capacitor 10 may preferably be, for example, about 0.6 mm long (in the length direction L), about 0.3 mm wide (in the width direction W), and about 0.3 mm high (in the stacking direction T). The dimension of each of the inner dielectric layers 122 (the dielectric layers 12 except for the outer dielectric layers and the margin) in the stacking direction T may preferably be, for example, equal to or more than about 0.3 μm and equal to or less than about 3.0 μm, and more preferably about 1.0 μm. The dimension of each of the first inner electrodes 13a and the second inner electrodes 13b in the stacking direction T may preferably be equal to or more than about 0.3 μm and equal to or less than about 3.0 μm, and more preferably about 0.7 μm. The dimension of the margin 123 in the width direction W, the dimension of each of the extended electrode portions of the first inner electrodes 13a in the length direction L, and the dimension of each of the extended electrode portions of the second inner electrodes 13b in the length direction L may each preferably be, for example, equal to or more than about 0.01 mm and equal to or less than about 0.1 mm, and more preferably about 0.03 mm. The thickness of each of the first outer electrode 20a and the second outer electrode 20b may preferably be, for example, equal to or more than about 3 μm and equal to or less than about 100 μm, and more preferably about 5 μm.

The dimension of the inner dielectric layers 122 in the stacking direction T may be determined by the following procedure. The multilayer ceramic capacitor 10 is ground such that the cross section passing through the midpoint of the multilayer ceramic capacitor 10 in the length direction L and extending in both the stacking direction T and the width direction W is exposed for observation under a scanning electron microscope. Then, the thickness of the inner dielectric layer 122 passing through the midpoint of the multilayer ceramic capacitor 10 in the stacking direction T is measured on five lines extending in the stacking direction T on the exposed cross section. The middle line among the five lines is the center line that passes through the midpoint in the width direction W. The five lines (the center line, two adjacent lines on one side in the width direction W, and two adjacent lines on the other side in the width direction W) are equally or substantially equally spaced in the width direction W. The average of the five measurement values obtained on the respective lines is taken as the dimension of each of the inner dielectric layers 122 in the stacking direction T.

For more precise measurements, the multilayer body 11 may be divided into an upper portion, a middle portion, and a lower portion that are aligned in the stacking direction T. The upper portion, the middle portion, and the lower portion are subjected to measurements to obtain five measurement values in each portion, and the average of the individual measurement values is taken as the dimension of each of the inner dielectric layers 122 in the stacking direction T. The dimension of each of the first inner electrodes 13a in the stacking direction T and the dimension of each of the second inner electrodes 13b in the stacking direction T may be determined in the same or similar manner.

Figure 5:
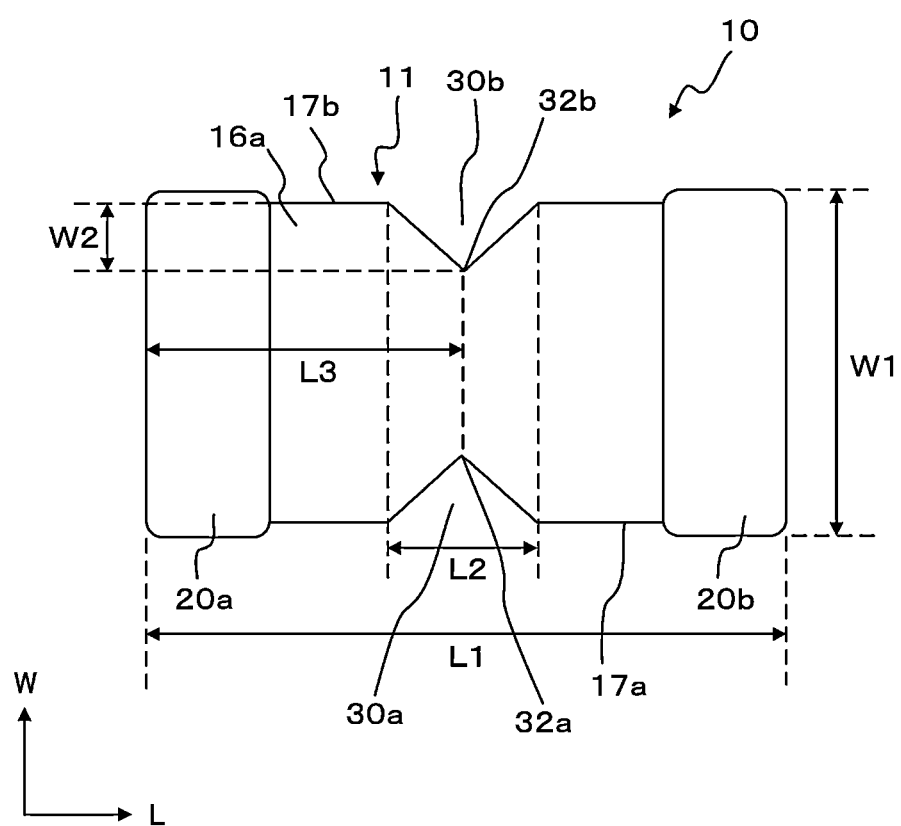
FIG. 5 is a plan view of the multilayer ceramic capacitor in FIG. 1, illustrating the multilayer ceramic capacitor as seen in the stacking direction for the purpose of aiding in the explanation of a dimension of a first recess and a dimension of a second recess according to a preferred embodiment of the present invention.

FIG. 5 is a plan view of the multilayer ceramic capacitor 10 in FIG. 1, illustrating the multilayer ceramic capacitor 10 as seen in the stacking direction T for the purpose of aiding in the explanation of the dimension of the first recess 30a and the dimension of the second recess 30b according to the present preferred embodiment. Let L1 denote the dimension of the multilayer ceramic capacitor 10 in the length direction L, and let W1 denote the dimension of the multilayer ceramic capacitor 10 in the width direction W. The maximum dimension of each of the first recess 30a and the second recess 30b in the length direction L is herein referred to as an indentation length and denoted by L2. The ratio of the indentation length L2 to the dimension L1 is preferably, for example, equal to or more than about 8.3% and equal to or less than about 83.4%, and more preferably about 16.7%.

The dimension of each of the first recess 30a and the second recess 30b in the width direction W is referred to as indentation depth and denoted by W2. The ratio of the indentation depth W2 to the dimension W1 is preferably, for example, equal to or more than about 3.3% and less than about 50.0%, and more preferably about 16.7%.

The bottom of the first recess 30a is denoted by 32a, and the bottom of the second recess 30b is denoted by 32b. Let L3 denote the dimension of a portion of the multilayer ceramic capacitor 10 between an end in the length direction L and the bottoms 32a and 32b. The ratio of the dimension L3 to the dimension L1 may preferably be, for example, about 50%.

The dimension L1 of the multilayer ceramic capacitor 10 may preferably be, for example, about 0.6 mm. The dimension W1 may preferably be, for example, about 0.3 mm. The indentation length L2 is preferably, for example, equal to or more than about 0.05 mm and equal to or less than about 0.5 mm, and more preferably about 0.1 mm. The indentation depth W2 is preferably, for example, equal to or more than about 0.01 mm and less than about 0.15 mm, and more preferably about 0.05 mm. The dimension L3 may preferably be, for example, about 0.3 mm.

The size of the multilayer ceramic capacitor 10 may be changed as required. For example, dimensions of the multilayer ceramic capacitor 10 as expressed as "(the dimension in the length direction L, the dimension in the width direction W, the dimension in the stacking direction T)" may be (about 5.7 mm, about 5.0 mm, about 5.0 mm), (about 4.5 mm, about 3.2 mm, about 3.2 mm), (about 3.2 mm, about 1.6 mm, about 1.6 mm), (about 2.1 mm, about 1.2 mm, about 1.2 mm), (about 1.6 mm, about 0.8 mm, about 0.8 mm), (about 1.0 mm, about 0.5 mm, about 0.5 mm), or (about 0.4 mm, about 0.2 mm, about 0.2 mm).

When the multilayer ceramic capacitor 10 according to the present preferred embodiment is viewed in the stacking direction T, the dimension of each of the first recess 30a and the second recess 30b in the length direction L is, as described above, smaller on the inner side than on the outer side in the width direction W. When the multilayer ceramic capacitor known in the art (i.e., the multilayer ceramic capacitor disclosed in Japanese Unexamined Patent Application Publication No. 2000-195741) is viewed in the stacking direction, its recesses have rectangular or substantially rectangular shapes and the dimension of each of the recesses in the length direction is constant on both the inner side and the outer side in the width direction.

When the depth of each of the first recess 30a and the second recess 30b (the dimension of each recess in the width direction) of the multilayer ceramic capacitor 10 according to the present preferred embodiment is equal to the depth of each recess of the multilayer ceramic capacitor known in the art, each recess of the multilayer ceramic capacitor 10 according to the present preferred embodiment is smaller than each recess of the multilayer ceramic capacitor known in the art. This means that the capacitance of the multilayer ceramic capacitor 10 according to the present preferred embodiment is greater than the capacitance of the multilayer ceramic capacitor disclosed in Japanese Unexamined Patent Application Publication No. 2000-195741.

The multilayer ceramic capacitor 10 according to the present preferred embodiment achieves the following advantage: the first recess 30a in the first side surface 17a and the second recess 30b in the second side surface 17b prevent the first side surface 17a and the second side surface 17b from contacting solder balls disposed on a substrate onto which the multilayer ceramic capacitor 10 is mounted. When the multilayer ceramic capacitor 10 is viewed in the stacking direction T, the dimension of each of the first recess 30a and the second recess 30b in the length direction L is smaller on the inner side than on the outer side in the width direction W. This structure reduces or prevents the reduction in the capacitance of the capacitor.

The first inner electrodes 13a and the second inner electrodes 13b of the multilayer ceramic capacitor 10 according to the present preferred embodiment are recessed inward in the width direction W and have a shape corresponding to the first recess 30a and the second recess 30b. In such a case, the area of each of the first inner electrodes 13a and the second inner electrodes 13b is greater than the area of each of the inner electrodes that have a rectangular or substantially rectangular shape, and the reduction in the capacitance of the capacitor will be reduced more effectively.

The multilayer ceramic capacitor known in the art includes rectangular or substantially rectangular recesses. When such multilayer ceramic capacitors are conveyed on a conveyor belt, a multilayer ceramic capacitor can partially get caught in a rectangular or substantially rectangular recess of another multilayer ceramic capacitor, such that cracks will be produced. Consequently, these multilayer ceramic capacitors will have poor yield rates. This is not the case with the multilayer ceramic capacitor 10 according to the present preferred embodiment. When the multilayer ceramic capacitor 10 is viewed in the stacking direction T, the dimension of each of the first recess 30a and the second recess 30b in the length direction L is smaller on the inner side than on the outer side in the width direction W. This structure reduces or prevents the possibility that a multilayer ceramic capacitor conveyed on a conveyor belt will be partially caught in either of two recesses (i.e., the first recess 30a and the second recess 30b) of another multilayer ceramic capacitor. The reduction in yield will be reduced or prevented accordingly.

The rectangular recesses of the multilayer ceramic capacitor known in the art are each defined by three surfaces, which are formed by making three cuts in a multilayer ceramic capacitor in the process of production. The first recess 30a of the multilayer ceramic capacitor 10 according to the present preferred embodiment is defined by two surfaces, each of which is denoted by 31a. The first recess 30a may thus be formed by making only two cuts in a multilayer ceramic capacitor in the process of production.

Figure 6:
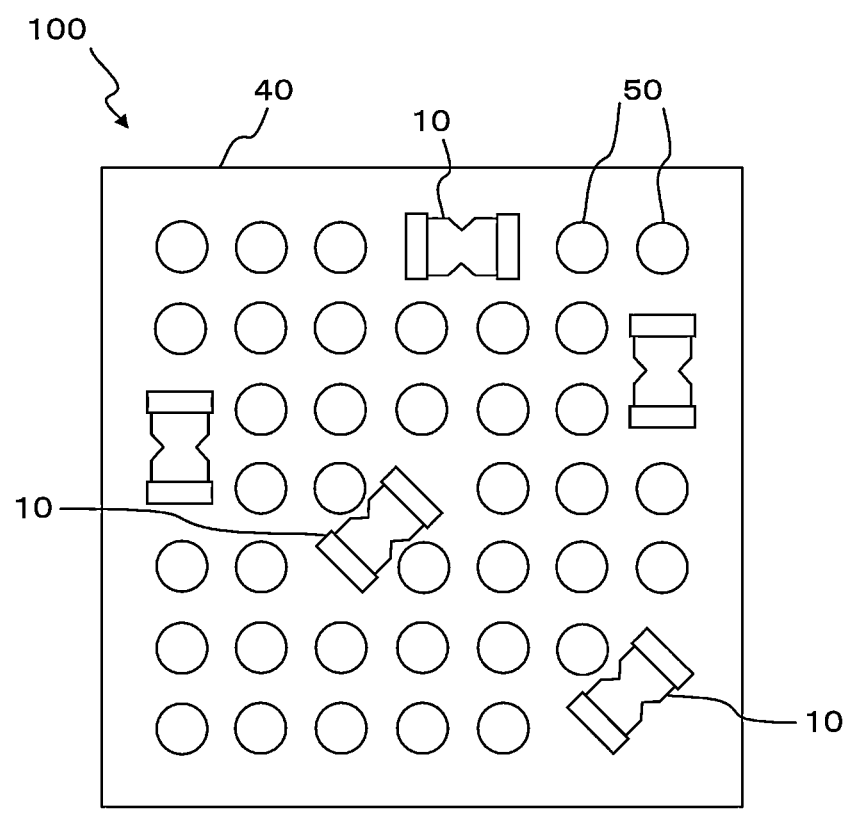
FIG. 6 is a plan view of a semiconductor device, schematically illustrating a structure in which the multilayer ceramic capacitors according to the first preferred embodiment of the present invention are disposed on a substrate.

FIG. 6 is a plan view of a semiconductor device 100, schematically illustrating a structure in which the multilayer ceramic capacitors 10 according to the first preferred embodiment are disposed on a substrate 40. The semiconductor device 100 includes the substrate 40, solder balls 50 on the substrate 40, and the multilayer ceramic capacitors 10 on the substrate 40. As illustrated in FIG. 6, the solder balls 50 are in a grid array on the substrate 40. The multilayer ceramic capacitors 10 do not overlap the solder balls 50 on the substrate 40.

Referring to FIG. 6, the substrate 40 has a rectangular or substantially rectangular shape, and a few of the multilayer ceramic capacitors 10 are oblique to the edges of the substrate 40. Some of the solder balls 50 are immediately beside the multilayer ceramic capacitors 10 that are oblique to the edges of the substrate 40 and are not in contact with the multilayer ceramic capacitors 10.

That is, the multilayer ceramic capacitors 10 according to the first preferred embodiment are disposed on the substrate 40 in such a manner as to avoid contact with the solder balls 50. This layout offers an advantage that a larger number of solder balls may be disposed on the substrate. This layout thus enables the substrate 40 to achieve enhanced dissipation of heat and to provide a larger number of signal paths.

As an example of a practical application, the semiconductor device 100 described above may be incorporated in a music player, a video player, a navigation apparatus, a communication apparatus, a mobile phone, a smartphone, a mobile information terminal, a tablet terminal, or a notebook computer, for example.

Method for Producing Multilayer Ceramic Capacitors

The following describes a non-limiting example of method for producing the multilayer ceramic capacitors 10.

In the first production step, ceramic green sheets, a conductive paste for forming inner electrodes, and a conductive paste for forming outer electrodes are prepared. The ceramic green sheets to be used may, for example, be well-known sheets and may each be obtained by coating a base material with a ceramic slurry including ceramic powder, resinous substances, and a solvent and by drying the ceramic slurry.

The ceramic slurry may include $CaTi$, $ZrO_3$, $SrZrO_3$, $BaTiO_3$, $BaTi$, or $CaO_3$, for example. The ceramic slurry may also, for example, resinous substances, each of which may be used as a dispersing agent or a binder. The concentration of solid matter in the ceramic slurry may preferably be, for example, equal to or more than about 10 vol % and equal to or less than about 27 vol %. The pigment volume concentration (PVC) of the ceramic powder, that is, the content of the ceramic powder in the total solid matter is preferably, for example, equal to or more than about 65% and equal to or less than about 95%.

The conductive paste for forming inner electrodes may include a metal, such as, for example, Ni, Cu, Ag, Pd, Pt, Fe, Ti, Cr, Sn, or Au, or a particle size precursor of the metal, and a solvent. The conductive paste for forming inner electrodes may also include, for example resinous substances, each of which may be used as a dispersing agent or a binder.

The viscosity of the paste for forming inner electrodes may preferably be, for example, equal to or more than about 5 mPa·s and equal to or less than about 50 Pa·s. The concentration of solid matter in the paste for forming inner electrodes may preferably be, for example, equal to or more than about 9 vol % and equal to or less than about 20.5 vol %. The PVC of the metal particles, that is, the content of metal particles in the total solid matter is preferably, for example, equal to or more than about 70% and equal to or less than about 95%. The diameter of metal particles may preferably be, for example, equal to or more than about 10 nm and equal to or less than about 500 nm.

The inner electrodes are formed in the subsequent production step, in which the ceramic green sheets are printed with the paste for forming inner electrodes. The paste for forming inner electrodes is applied to form a shape having an inwardly recessed outline so that the shape of the inner electrodes corresponds to the first recess 30a and the second recess 30b.

Then, a mother multilayer body is produced by the following procedure. A predetermined number of ceramic green sheets including no inner electrode pattern formed thereon, ceramic green sheets including inner electrode patterns formed thereon, and a predetermined number of ceramic green sheets including no inner electrodes formed thereon are stacked on one another in this order. The mother multilayer body is formed such that a plurality of multilayer ceramic capacitors 10 are obtained at the same time from the multilayer body.

The mother multilayer body is then subjected to rigid pressing, isostatic pressing, or the like, for example. The mother multilayer body may be pressed at temperatures falling within the range of, for example, about 25° C. to about 200° C. The pressure applied to the mother multilayer body may be, for example, equal to or more than about 1 MPa and equal to or less than about 200 MPa.

Figure 7:
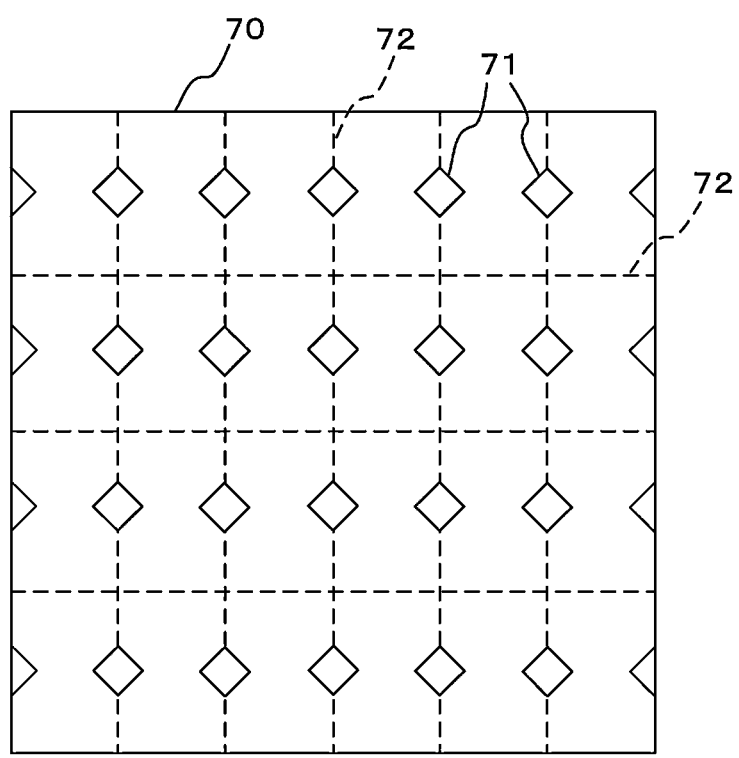
FIG. 7 is provided to explain a non-limiting example of a method for producing the multilayer ceramic capacitor according to the first preferred embodiment of the present invention, or more specifically, a method for punching holes corresponding to first recesses and second recesses of multilayer ceramic capacitors through a mother multilayer body.

Then, holes are punched through the mother multilayer body by using a push cutter, a mechanical punch, or the like, for example, such that the holes correspond to the first recesses 30a and the second recesses 30b of the multilayer ceramic capacitors 10. The resultant state is illustrated in FIG. 7, in which the mother multilayer body is denoted by 70, and the holes are denoted by 71. Subsequently, multilayer chips are obtained by cutting the mother multilayer body 70 into a predetermined size with a dicing machine, laser beams, or the like, for example. Referring to FIG. 7, broken lines 72 denote lines along which the mother multilayer body 70 is cut. The cutting may be followed by barrel polishing or the like, for example, in which case corners and ridges of the multilayer chips are rounded.

Alternatively, the mother multilayer body 70 may be cut into a predetermined size when the holes corresponding to the first recesses 30a and the second recesses 30b are punched. The simultaneous cutting and punching may be accomplished by using, for example, a push cutter for cutting the mother multilayer body into pieces and punching the holes corresponding to the first recesses 30a and the second recesses 30b.

Figure 8A:
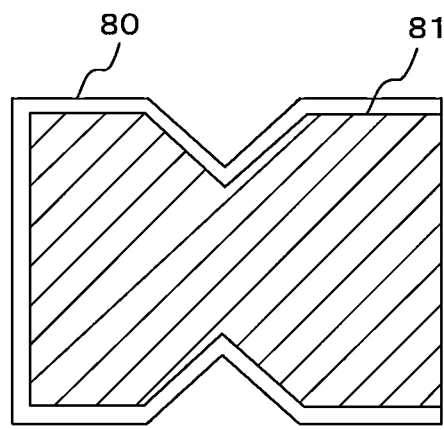
FIGS. 8A and 8B are provided to explain a non-limiting example of a method for producing multilayer chips by printing with a ceramic slurry and a conductive paste for forming inner electrodes.
Figure 8B:
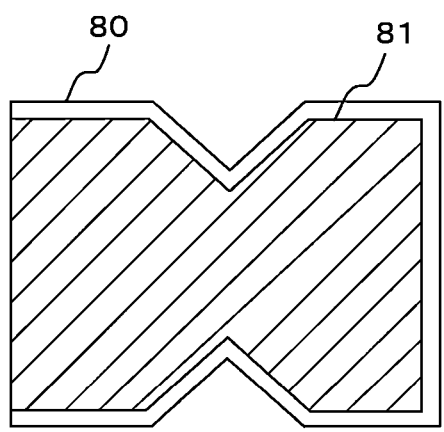

As another alternative, a printing apparatus such as, for example, a 3D printer may be used to produce multilayer chips. That is, printing techniques may be used to produce multilayer chips, each of which is then fired to obtain the multilayer body including the first recess 30a and the second recess 30b. Specifically, ceramic slurry 80 is applied to form layers each having the shape illustrated in FIG. 8A, and a conductive paste 81 for forming inner electrodes is then applied on the top layer to form a layer having the shape illustrated in FIG. 8B. Subsequently, the ceramic slurry 80 is applied thereon to form another layer having the shape illustrated in FIG. 8B, and the conductive paste 81 for forming inner electrodes is applied on the resultant layer to form still another layer having the shape illustrated in FIG. 8B. The ceramic slurry 80 is applied thereon to form a layer having the shape illustrated in FIG. 8A, and the conductive paste 81 for forming inner electrodes is applied on the resultant layer to form another layer having the shape illustrated in FIG. 8A. The ceramic slurry 80 and the conductive paste 81 for forming inner electrodes are alternately applied in the same manner. After this printing process is iterated, the ceramic slurry 80 is applied on the outer side in the stacking direction to form layers each having the shape illustrated in FIG. 8A. In this way, multilayer chips are produced.

A conductive paste for forming outer electrodes is then applied to the multilayer chips such that two end surfaces of each multilayer chip are coated with the paste and two principal surfaces and two side surfaces of each multilayer chip are partially coated with the paste. The conductive paste for forming outer electrodes may include, for example, a metal or a particle size precursor of the metal, and a solvent. The conductive paste for forming outer electrodes may also include, for example, resinous substances, each of which may be used as dispersing agent or a binder. The concentration of solid matter in the paste for forming outer electrodes may preferably be, for example, equal to or more than about 9 vol % and equal to or less than about 20.5 vol %. The PVC of the metal particles, that is, the content of metal particles in the total solid matter is preferably, for example, equal to or more than about 70% and equal to or less than about 95%.

In the subsequent step, the multilayer chips are fired. The multilayer chips may be fired at temperatures falling within the range of about 900° C. to about 1,300° C., for example. The firing temperature may be changed to better suit the ceramic material or the conductive paste that is used. In this way, a multilayer body and metal layers defining and functioning as outer electrodes are formed.

Alternatively, the multilayer chips may be fired before and after being coated with the paste for forming outer electrodes.

The metal layers may be finished by plating if appropriate. The metal layers may be plated with Ni and thereafter plated with Sn, for example.

These processes may be used in the production of the multilayer ceramic capacitors 10.

Second Preferred Embodiment

Figure 9:
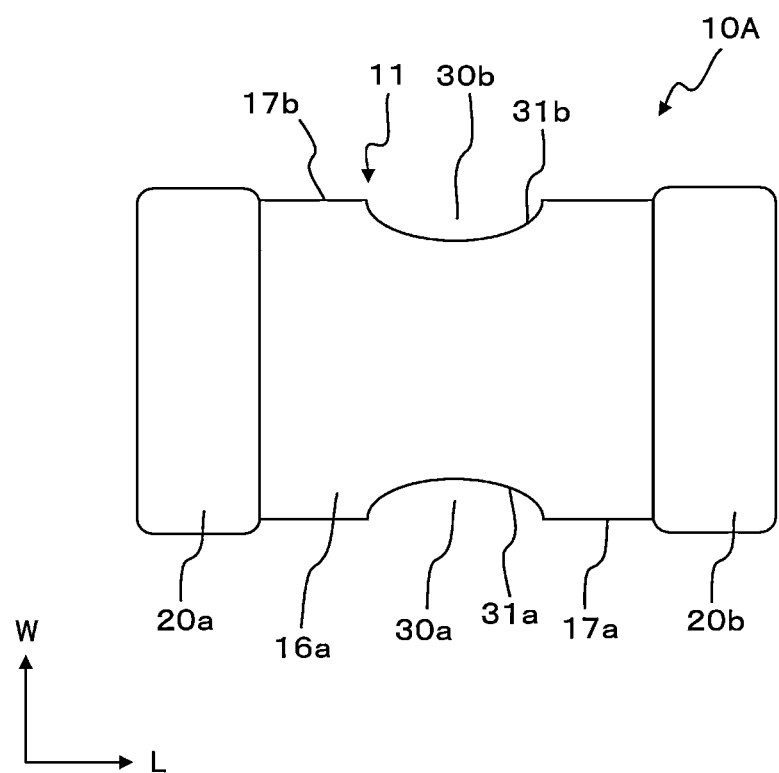
FIG. 9 is a plan view of a multilayer ceramic capacitor according to a second preferred embodiment of the present invention, illustrating the multilayer ceramic capacitor as seen in the stacking direction.

FIG. 9 is a plan view of a multilayer ceramic capacitor 10A according to a second preferred embodiment of the present invention, illustrating the multilayer ceramic capacitor 10A as seen in the stacking direction T. The difference between the multilayer ceramic capacitor 10A according to the second preferred embodiment and the multilayer ceramic capacitor 10 according to the first preferred embodiment is in the shape of the first recess 30a and the second recess 30b.

There are some commonalities between the multilayer ceramic capacitor 10 according to the first preferred embodiment and the multilayer ceramic capacitor 10A according to the second preferred embodiment. The first side surface 17a of the multilayer body 11 includes the first recess 30a, where the midsection of the first side surface 17a in the length direction L is recessed inward in the width direction W, and the second side surface 17b of the multilayer body 11 includes the second recess 30b, where the midsection of the second side surface 17b in the length direction L is recessed inward in the width direction W. When the multilayer ceramic capacitor 10A is viewed in the stacking direction T, the dimension of each of the first recess 30a and the second recess 30b in the length direction L is smaller on the inner side than on the outer side in the width direction W. As with the multilayer ceramic capacitor 10 according to the first preferred embodiment, the multilayer ceramic capacitor 10A according to the second preferred embodiment thus offers the following advantage: the first recess 30a in the first side surface 17a and the second recess 30b in the second side surface 17b prevent the first side surface 17a and the second side surface 17b from contacting solder balls disposed on a substrate onto which the multilayer ceramic capacitor 10A is mounted, and this structure reduces or prevents the reduction in capacitance.

In the present preferred embodiment, the first recess 30a and the second recess 30b, respectively, are defined by a surface 31a and a surface 31b, which are each substantially arc-shaped when the multilayer ceramic capacitor 10A is viewed in the stacking direction T. The term arc herein refers to a circular arc, an elliptical arc, or any other suitable shape defined by a curve.

Figure 10:
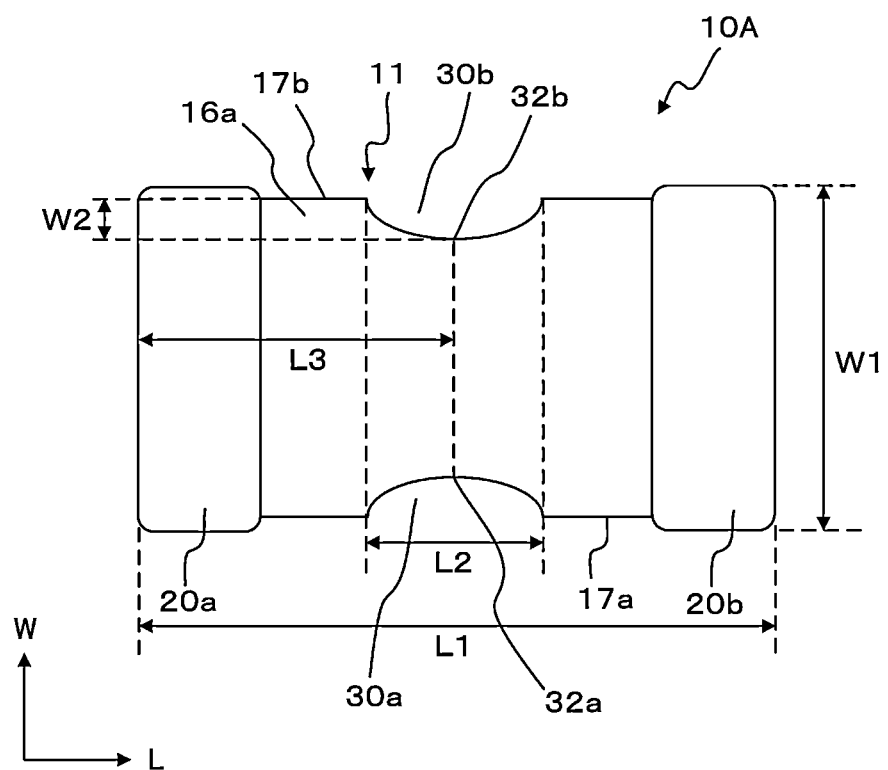
FIG. 10 is a plan view of the multilayer ceramic capacitor in FIG. 9, illustrating the multilayer ceramic capacitor as seen in the stacking direction for the purpose of aiding in the explanation of dimension of a first recess and the dimension of a second recess according to a preferred embodiment of the present invention.

FIG. 10 is a plan view of the multilayer ceramic capacitor 10A in FIG. 9, illustrating the multilayer ceramic capacitor 10A as seen in the stacking direction T for the purpose of aiding in the explanation of the dimension of the first recess 30a and the dimension of the second recess 30b according to a preferred embodiment. Let L1 denote the dimension of the multilayer ceramic capacitor 10A in the length direction L, and let W1 denote the dimension of the multilayer ceramic capacitor 10A in the width direction W. The dimension of each of the first recess 30a and the second recess 30b in the length direction L is herein referred to as indentation length and denoted by L2. The ratio of the indentation length L2 to the dimension L1 is preferably, for example, equal to or more than about 8.3% and equal to or less than about 83.4%, and more preferably about 38.3%. The dimension of each of the first recess 30a and the second recess 30b in the width direction W is herein referred to as indentation depth and denoted by W2. The ratio of the indentation depth W2 to the dimension W1 in the width direction is preferably, for example, equal to or more than about 3.3% and equal to or less than about 36.7%, and more preferably about 13.3%. The bottom of the first recess 30a is denoted by 32a, and the bottom of the second recess 30b is denoted by 32b. Let L3 denote the dimension of a portion of the multilayer ceramic capacitor 10A between an end in the length direction L and the bottoms 32a and 32b. The ratio of the dimension L3 to the dimension L1 may preferably be about 50%, for example.

The dimension L1 of the multilayer ceramic capacitor 10A may preferably be, for example, about 0.6 mm. The dimension W1 may preferably be, for example, about 0.3 mm. The indentation length L2 is preferably, for example, equal to or more than about 0.05 mm and equal to or less than about 0.5 mm, and more preferably about 0.23 mm. The indentation depth W2 is preferably, for example, equal to or more than about 0.01 mm and equal to or less than about 0.11 mm, and more preferably about 0.04 mm. The dimension L3 may preferably be, for example, about 0.3 mm.

In the multilayer ceramic capacitor 10 according to the first preferred embodiment, the two flat surfaces 31a meet at the bottom 32a of the first recess 30a, and the two flat surfaces 31b meet at the bottom 32b of the second recess 30b. For this reason, cracks can be produced in the bottom 32a of the first recess 30a and the bottom 32b of the second recess 30b. Alternatively, the bottoms 32a and 32b may be substantially arc-shaped to reduce or prevent the possibility of cracking.

In the multilayer ceramic capacitor 10A according to the second preferred embodiment, the surface 31a defining the first recess 30a and the surface 31b defining the second recess 30b are substantially arc-shaped. That is, the surfaces 31a and 31b are curved. Accordingly, the possibility of cracking is further reduced or prevented.

Third Preferred Embodiment

Figure 11:
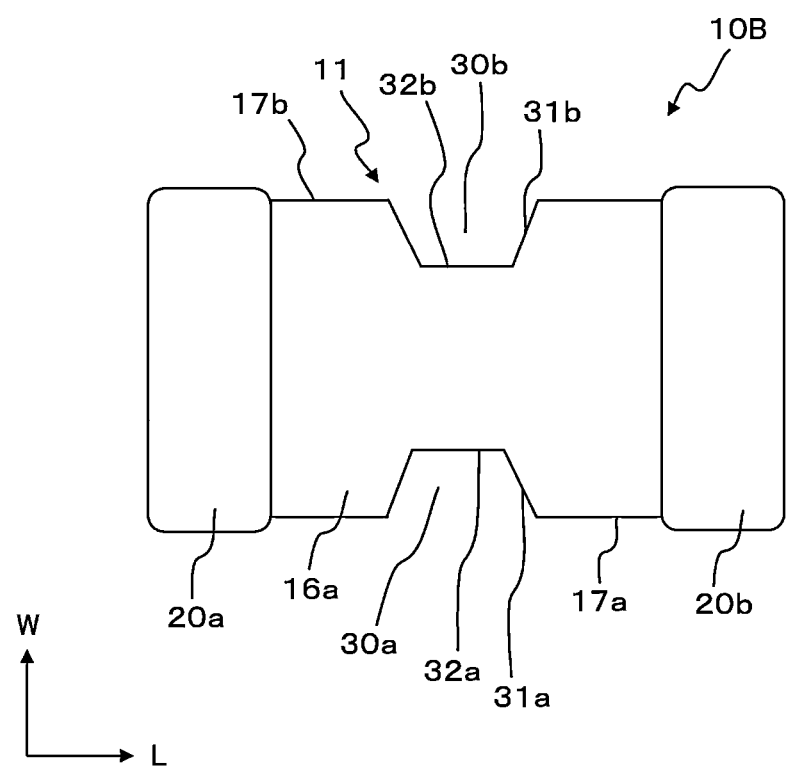
FIG. 11 is a plan view of a multilayer ceramic capacitor according to a third preferred embodiment of the present invention, illustrating the multilayer ceramic capacitor as seen in the stacking direction.
Figure 12:
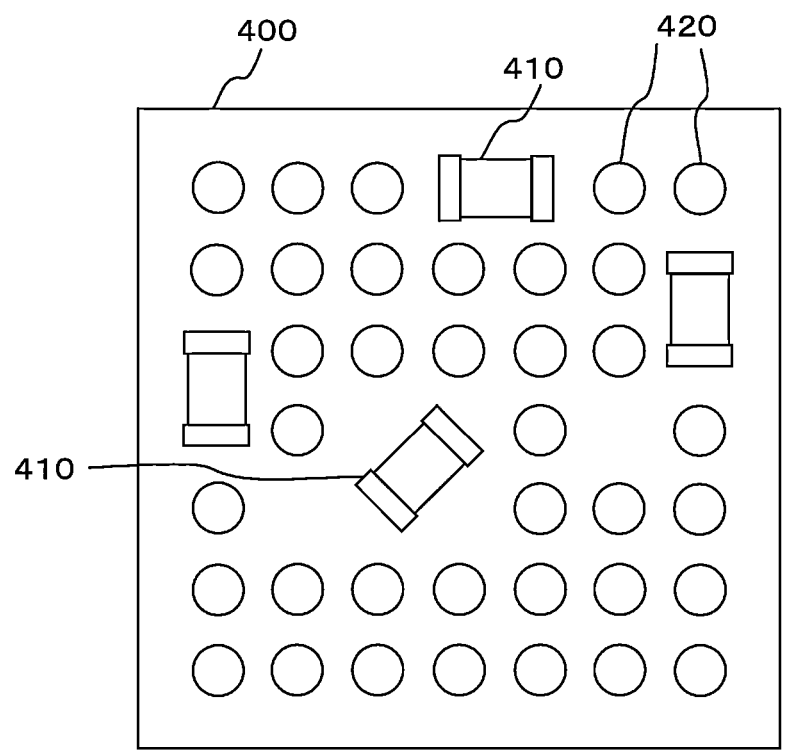
FIG. 12 is a plan view of the structure disclosed in U.S. Pat. No. 9,263,186, illustrating multilayer ceramic capacitors and solder balls disposed on a substrate.
Figure 13:
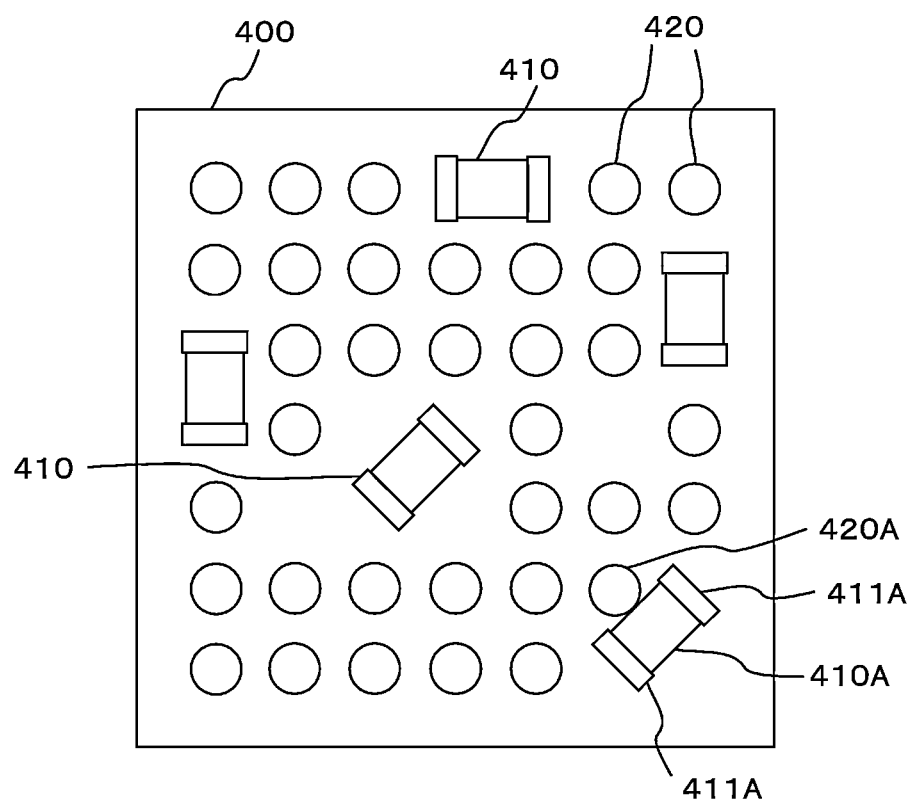
FIG. 13 illustrates a state in which multilayer ceramic capacitors known in the art and solder balls are disposed on a substrate, with one of the solder balls being in contact with a side surface of one of the multilayer ceramic capacitors.
Figure 14:
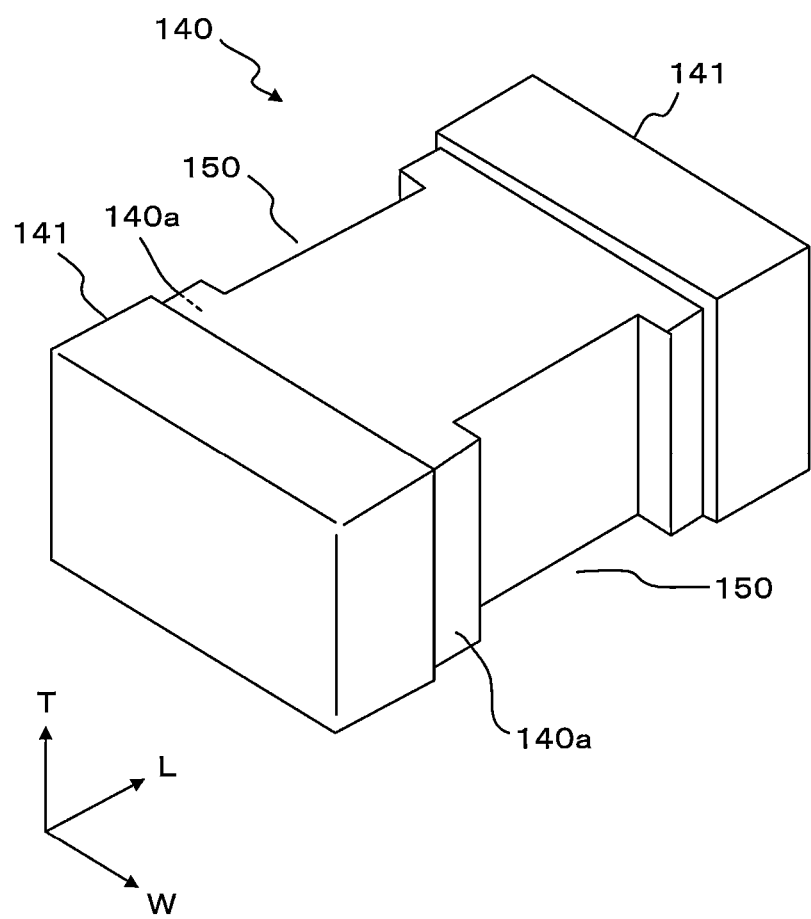
FIG. 14 is a perspective view of a multilayer ceramic capacitor disclosed in Japanese Unexamined Patent Application Publication No. 2000-195741, illustrating the multilayer ceramic capacitor whose side surfaces have their respective rectangular recesses.

FIG. 11 is a plan view of a multilayer ceramic capacitor 10B according to a third preferred embodiment of the present invention, illustrating the multilayer ceramic capacitor 10B as seen in the stacking direction T. The difference between the multilayer ceramic capacitor 10B according to the third preferred embodiment and the multilayer ceramic capacitor 10 according to the first preferred embodiment is in the shape of the first recess 30a and the second recess 30b.

There are some commonalities between the multilayer ceramic capacitor 10 according to the first preferred embodiment and the multilayer ceramic capacitor 10B according to the third preferred embodiment. The first side surface 17a of the multilayer body 11 includes the first recess 30a, where the midsection of the first side surface 17a in the length direction L is recessed inward in the width direction W, and the second side surface 17b of the multilayer body 11 includes the second recess 30b, where the midsection of the second side surface 17b in the length direction L is recessed inward in the width direction W. When the multilayer ceramic capacitor 10B is viewed in the stacking direction T, the dimension of each of the first recess 30a and the second recess 30b in the length direction L is smaller on the inner side than on the outer side in the width direction W. As with the multilayer ceramic capacitor 10 according to the first preferred embodiment, the multilayer ceramic capacitor 10B according to the third preferred embodiment thus offers the following advantage: the first recess 30a in the first side surface 17a and the second recess 30b in the second side surface 17b prevent the first side surface 17a and the second side surface 17b from contacting solder balls disposed on a substrate onto which the multilayer ceramic capacitor 10B is mounted, and this structure reduces or prevents the reduction in capacitance.

When the multilayer ceramic capacitor 10B according to the present preferred embodiment is viewed in the stacking direction T, the first recess 30a and the second recess 30b have a trapezoidal or substantially trapezoidal shape. That is, the bottom 32a of the first recess 30a and the bottom 32b of the second recess 30b are flat.

The multilayer ceramic capacitor according to the present invention offers the following advantage: the first recess in the first side surface and the second recess in the second side surface prevent the first side surface and the second side surface from contacting solder balls disposed on a substrate onto which the multilayer ceramic capacitor is mounted. When the multilayer ceramic capacitor is viewed in the stacking direction, the dimension of each of the first recess and the second recess in the length direction is smaller on the inner side than on the outer side in the width direction. This structure is more effective in reducing or preventing the reduction in the capacitance of the capacitor than the structure in which the dimension of each recess in the length direction is constant on both the inner side and the outer side in the width direction.

It should be noted that the present invention is not limited to the preferred embodiments above and various applications and alterations are possible within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
a multilayer body including dielectric layers, first inner electrodes, and second inner electrodes, the dielectric layers and the first and second inner electrodes being stacked on one another, the multilayer body including a first principal surface, a second principal surface, a first side surface, a second side surface, a first end surface, and a second end surface, the first principal surface being opposite the second principal surface in a stacking direction in which the dielectric layers, the first inner electrodes, the second inner electrodes are stacked on one another, the first side surface being opposite the second side surface in a width direction orthogonal or substantially orthogonal to the stacking direction, the first end surface being opposite the second end surface in a length direction orthogonal or substantially orthogonal to both the stacking direction and the width direction;
a first outer electrode electrically connected to the first inner electrodes and located on the first end surface of the multilayer body; and
a second outer electrode electrically connected to the second inner electrodes and located on the second end surface of the multilayer body; wherein
the first side surface includes a first recess where a midsection of the first side surface in the length direction is recessed inward in the width direction;
the second side surface includes a second recess where a midsection of the second side surface in the length direction is recessed inward in the width direction;
when the multilayer ceramic capacitor is viewed in the stacking direction, a dimension of each of the first recess and the second recess in the length direction is smaller on an inner side than on an outer side in the width direction; and
each of the first and second recesses has a trapezoidal or substantially trapezoidal shape when the multilayer ceramic capacitor is viewed in the stacking direction.

2. The multilayer ceramic capacitor according to claim 1, wherein the first inner electrodes and the second inner electrodes are recessed inward in the width direction and have a shape corresponding to the first and second recesses.

3. A semiconductor device comprising:
a substrate;
solder balls on the substrate; and
the multilayer ceramic capacitor according to claim 1; wherein
the multilayer ceramic capacitor is on the substrate.

4. The semiconductor device according to claim 3, wherein the semiconductor device is included in a music player, a video player, a navigation apparatus, a communication apparatus, a mobile phone, a smartphone, a mobile information terminal, a tablet terminal, or a notebook computer.

5. The semiconductor device according to claim 3, wherein the first inner electrodes and the second inner electrodes are recessed inward in the width direction and have a shape corresponding to the first and second recesses.

6. The multilayer ceramic capacitor according to claim 1, wherein each of the dielectric layers includes at least one of $BaTiO_3$, $CaTiO_3$, $SrTiO_3$, $SrZrO_3$, or $CaZrO_3$ as a principal component.

7. The multilayer ceramic capacitor according to claim 6, wherein each of the dielectric layers further includes at least one of a Mn compound, a Fe compound, a Cr compound, a Co compound, or a Ni compound as an accessory component.

8. The multilayer ceramic capacitor according to claim 1, wherein a ratio of a maximum dimension of each of the first and second recesses in the length direction to a dimension of the multilayer ceramic capacitor in the length direction is equal to or more than about 8.3% and equal to or less than about 83.4%.

9. The multilayer ceramic capacitor according to claim 1, wherein a maximum dimension of each of the first and second recesses in the width direction to a dimension of the multilayer ceramic capacitor in the width direction equal to or more than about 3.3% and less than about 50.0%.

10. The semiconductor device according to claim 3, wherein each of the dielectric layers includes at least one of $BaTiO_3$, $CaTiO_3$, $SrTiO_3$, $SrZrO_3$, or $CaZrO_3$ as a principal component.

11. The semiconductor device according to claim 10, wherein each of the dielectric layers further includes at least one of as Mn compounds, Fe compounds, Cr compounds, Co compounds, or Ni compounds as an accessory component.

12. The semiconductor device according to claim 3, wherein a ratio of a maximum dimension of each of the first and second recesses in the length direction to a dimension of the multilayer ceramic capacitor in the length direction is equal to or more than about 8.3% and equal to or less than about 83.4%.

13. The semiconductor device according to claim 3, wherein a maximum dimension of each of the first and second recesses in the width direction to a dimension of the multilayer ceramic capacitor in the width direction equal to or more than about 3.3% and less than about 50.0%.

* * * * *